United States Patent
Lu

(10) Patent No.: US 11,144,136 B2
(45) Date of Patent: Oct. 12, 2021

(54) MOUSE CAPABLE OF RECEIVING STYLUS PEN

(71) Applicant: DEXIN CORPORATION, New Taipei (TW)

(72) Inventor: Ho Lung Lu, New Taipei (TW)

(73) Assignee: DEXIN CORPORATION, New Taipei (TW)

(*) Notice: Subject to any disclaimer, the term of this patent is extended or adjusted under 35 U.S.C. 154(b) by 0 days.

(21) Appl. No.: 16/775,849

(22) Filed: Jan. 29, 2020

(65) Prior Publication Data

US 2021/0081058 A1 Mar. 18, 2021

(30) Foreign Application Priority Data

Sep. 12, 2019 (TW) .................. 108132909

(51) Int. Cl.
*G06F 3/0354* (2013.01)
*H04W 4/80* (2018.01)
*H05K 5/00* (2006.01)
*H05K 5/02* (2006.01)

(52) U.S. Cl.
CPC ...... *G06F 3/03543* (2013.01); *G06F 3/03545* (2013.01); *H04W 4/80* (2018.02); *H05K 5/0086* (2013.01); *H05K 5/0286* (2013.01)

(58) Field of Classification Search
CPC .. G06F 3/033; G06F 3/03543; G06F 3/03545; H05K 5/0086; H05K 5/0286
See application file for complete search history.

(56) References Cited

U.S. PATENT DOCUMENTS

| 2007/0024601 | A1  |   | 2/2007 | Liu et al. |            |
|--------------|-----|---|--------|------------|------------|
| 2008/0165163 | A1  | * | 7/2008 | Bathiche   | G06F 3/03545 |
|              |     |   |        |            | 345/179    |
| 2019/0064943 | A1  | * | 2/2019 | Chang      | G06F 3/03545 |

FOREIGN PATENT DOCUMENTS

| CN | 2828921 Y      |   | 10/2006 |
|----|----------------|---|---------|
| JP | H10187346 A    |   | 7/1998  |
| JP | H10207841 A    |   | 8/1998  |
| JP | H11194888 A    |   | 7/1999  |
| TW | m446366 U      | * | 2/2013  |
| WO | WO2009054478 A1 |   | 4/2009  |

OTHER PUBLICATIONS

Office action issued in corresponding TW Application No. 108132909 dated Jun. 17, 2020.
Search report issued in corresponding TW Application No. 108132909 with a completion date of Jun. 16, 2020, and its English translation.

* cited by examiner

*Primary Examiner* — Robert J Michaud
(74) *Attorney, Agent, or Firm* — Muncy, Geissler, Olds & Lowe, P.C.

(57) ABSTRACT

A mouse capable of receiving a stylus pen, characterized in that: a housing space capable of receiving a stylus pen is provided in the mouse, where the housing space forms an opening at a side of the mouse, and the stylus pen is placed inside the opening and is fixed in the housing space. An objective of the present invention is to provide a mouse capable of receiving a stylus pen, to store the stylus pen into the mouse, so as to reduce space occupied by peripheral devices and avoid making a working environment in a mess.

6 Claims, 9 Drawing Sheets

MOUSE CAPABLE OF RECEIVING STYLUS PEN

BACKGROUND

Technical Field

The present invention relates to the field of peripheral devices of a computer, and in particular, to a mouse capable of receiving a stylus pen.

Related Art

FIG. 1 is a schematic diagram of a conventional touch screen used as an extended screen of a main screen. In FIG. 1, after being connected to a computer (not shown in the figure), an original main screen 10 turns to be dual screens, and one of the screens is a touch screen 12. The touch screen 12 may be set as an extension mode. After a USB cable (not shown in the figure) is connected to the touch screen 12 and a driver is installed, the touch screen 12, like a touchpad, may be clicked by using a stylus pen 14 in the same manner as operating a mouse 16 to trigger a mouse event.

In FIG. 1, peripheral devices of a computer system include a main screen 10, a touch, screen 12, a stylus pen 14, a mouse 16, and the like. Those peripheral devices make the working environment in a mess, and some space is needed if the peripheral devices are to be stored.

SUMMARY

In view of the foregoing problem, an objective of the present invention is to provide a mouse capable of receiving a stylus pen, so that the stylus pen may be stored inside the mouse, hence less space is needed when those peripheral devices are to be stored and the working environment is neat.

An aspect of the present invention provides a mouse capable of receiving a stylus pen, characterized in that:

a housing space capable of receiving a stylus pen is provided in the mouse, wherein the housing space forms an opening at the central side, left and right sides or lower side of the mouse, and the stylus pen is placed inside the opening and is fixed in the housing space.

According to the aspect of the present invention, internal threads are formed on an inner wall of the housing space of the mouse, external threads are formed on a surface of a pen shaft of the stylus pen, and the external threads of the stylus pen are screwed into the internal threads of the mouse.

According to the aspect of the present invention, a flexible engagement part is disposed at a side edge of a pen shaft of the stylus pen, and the flexible engagement part of the stylus pen is elastically clamped on the inner wall of the housing space when the stylus pen is placed inside the housing space.

According to the aspect of the present invention, one or more leaf springs are disposed on the inner wall of the housing space of the mouse, and the leaf springs of the mouse elastically clamp the stylus pen when the stylus pen is placed inside the housing space.

According to the aspect of the present invention, the length of the stylus pen is adjusted by means of pressing.

According to the aspect of the present invention, the stylus pen includes a battery disposed inside a pen shaft of the stylus pen and a switch disposed at a side edge of the pen shaft of the stylus pen, the battery supplies power to the stylus pen, and when the stylus pen is placed inside the housing space, the inner wall of the housing space of the mouse presses the switch, and the pressed switch cuts off the power supplied by the battery to the stylus pen.

According to the aspect of the present invention, an electrical contact is disposed on the inner wall of the housing space of the mouse, an electrical contact is disposed on the surface of a pen shaft of the stylus pen, and when the stylus pen is placed inside the housing space to make the electrical contact of the mouse and the electrical contact of the stylus pen electrically connected, the stylus pen is charged by a computer system through the mouse, or the stylus pen is charged by a battery in the mouse, where the electrical contact of the mouse and the electrical contact of the stylus pen are special contacts or USB normative contacts.

According to the aspect of the present invention, when the stylus pen is inserted into the housing space and the electrical contact of the mouse is electrically connected to the electrical contact of the stylus pen, the mouse or a Bluetooth module of the stylus pen sends a mode switching signal to instruct a computer system to switch from the first mode to the second mode of a man-machine operation graphical interface, and when the stylus pen is removed from the housing space, the mouse or the Bluetooth module of the stylus pen sends the mode switching signal to instruct the computer system to switch from the second mode to the first mode of the man-machine operation graphical interface.

According to the aspect of the present invention, when the stylus pen is inserted into the housing space and the electrical contact of the mouse is electrically connected to the electrical contact of the stylus pen, the USB contact of the mouse is electrically connected to one of the following computer systems: a Windows system, a Mac system, and an Android system, and a stylus pen operation protocol is written into a memory of the stylus pen by the computer system through the electrical contact of the mouse and the electrical contact of the stylus pen.

According to the aspect of the present invention, the housing space is provided at the lower side of the mouse, the stylus pen is placed inside the housing space, and a side cover plate covers the housing space and the stylus pen.

DETAILED DESCRIPTION

To help a person of ordinary skill in the technical field of the present invention to further understand the present invention, preferred embodiments of the present invention are listed below, and content of the present invention and expected effects thereof are described in detail with reference to the accompanying drawings.

Figure 1:
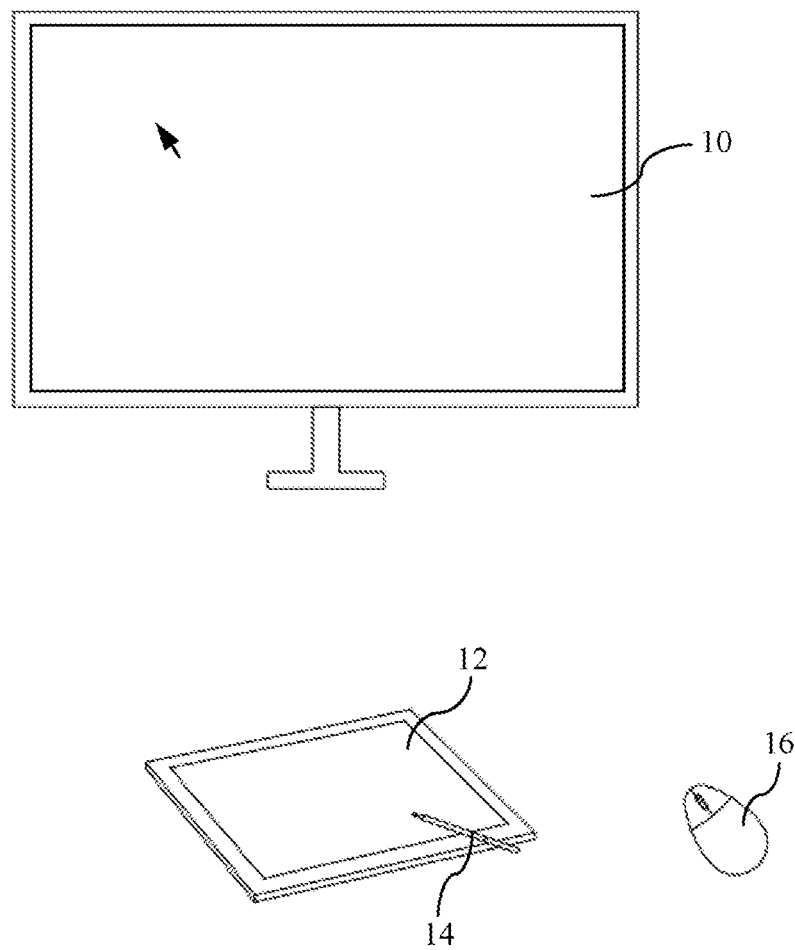
FIG. 1 is a schematic diagram of a conventional touch screen used as an extended screen of a main screen.
Figure 2:
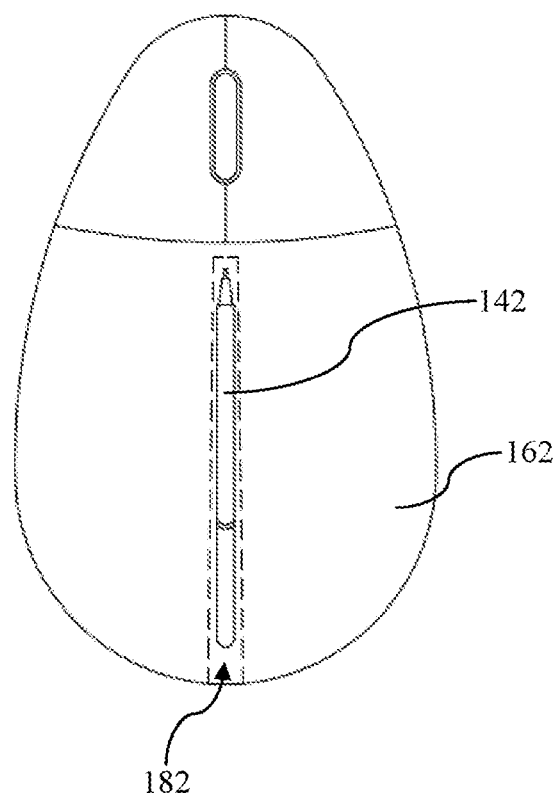
FIG. 2 is a schematic diagram of a mouse capable of receiving a stylus pen according to a first embodiment of the present invention.

FIG. 2 is a schematic diagram of a mouse capable of receiving a stylus pen according to a first embodiment of the present invention. A housing space 182 capable of receiving a stylus pen 142 is provided in a mouse 162. In the first embodiment, the housing space 182 is located inside a central side of the mouse 162 (viewed from above the mouse 162), the housing space 182 form an opening at a side of the mouse 162, and the stylus pen 142 is inserted into the housing space 182 from the opening of the housing space 182.

Figure 3:
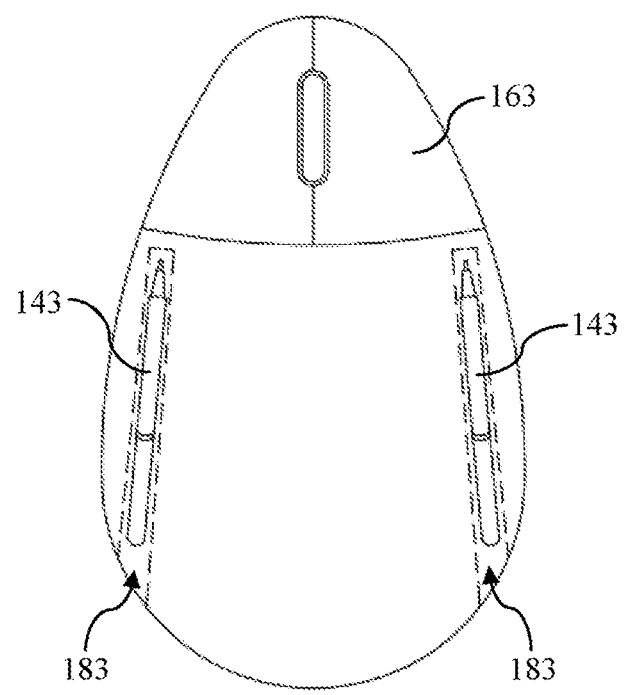
FIG. 3 is a schematic diagram of a mouse capable of receiving a stylus pen according to a second embodiment of the present invention.

FIG. 3 is a schematic diagram of a mouse capable of receiving a stylus pen according to a second embodiment of the present invention. A housing space 183 capable of receiving a stylus pen 143 is provided in a mouse 163. In the second embodiment, two housing spaces 183 are respectively provided on the left and right sides of the mouse 163 (viewed from above the mouse 163), the two housing spaces 183 form respective openings on the left side and the right side of the mouse 163, and the stylus pens 143 are respectively inserted into the housing spaces 183 from the openings of the two housing spaces 183.

Figure 4:
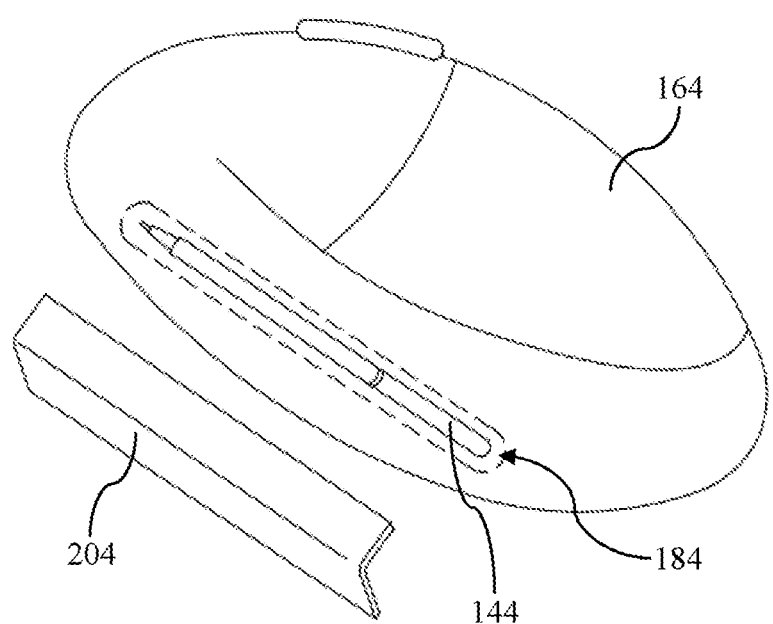
FIG. 4 is a schematic diagram of a mouse capable of receiving a stylus pen according to a third embodiment of the present invention.

FIG. 4 is a schematic diagram of a mouse capable of receiving a stylus pen according to a third embodiment of the present invention. A housing space 184 capable of receiving a stylus pen 144 is provided in a mouse 164. In the third embodiment, the housing space 184 is provided at the lower side of the mouse 164 (viewed from a side of the mouse 164) and forms an exposed opening, the stylus pen 144 is placed inside the housing space 184, and a side cover plate 204 covers the housing space 184 and the stylus pen 144.

Figures 5A, 5B:
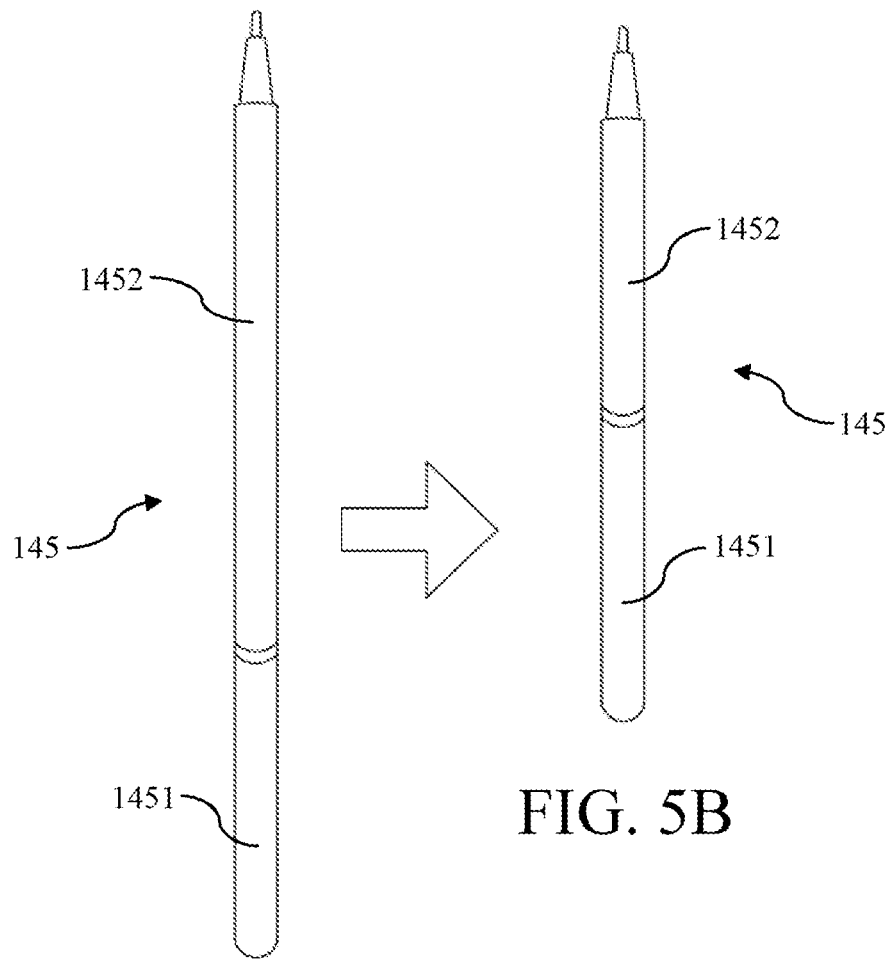
FIG. 5A is a schematic diagram of a stylus pen in a general state according to the present invention.
FIG. 5B is a schematic diagram of a stylus pen in a shortened state according to the present invention.

FIG. 5A is a schematic diagram of a stylus pen in a general state according to the present invention, and FIG. 5B is a schematic diagram of a stylus pen in a shortened state according to the present invention. In FIG. 5A, the length of a stylus pen 145 is generally longer than the length of the housing space 182 in FIG. 2, and therefore, when the stylus pen 145 is inserted into the housing space 182, the stylus pen 145 may not be fully or wholly received therein hence fail to achieve a good storage effect.

Therefore, the stylus pen 145 is formed by using a conventional structure that adjusts the length by means of pressing. A first pen shaft 1451 of the stylus pen 145 is pressed towards a second pen shaft 1452, and the second pen shaft 1452 retracts towards the interior of the first pen shaft 1451, to reduce the overall length of the stylus pen 145 (as shown in FIG. 5B), so that the shortened stylus pen 145 may be stored into the housing space 182 of the mouse 162 (as shown in FIG. 2). After the stylus pen 145 is removed from the housing space 182 of the mouse 162, the first pen shaft 1451 is pressed again, and the second pen shaft 1452 extends in a direction away from the interior of the first pen shaft 1451, so that the stylus pen 145 is in a general length state (as shown in FIG. 5A).

Figure 6:
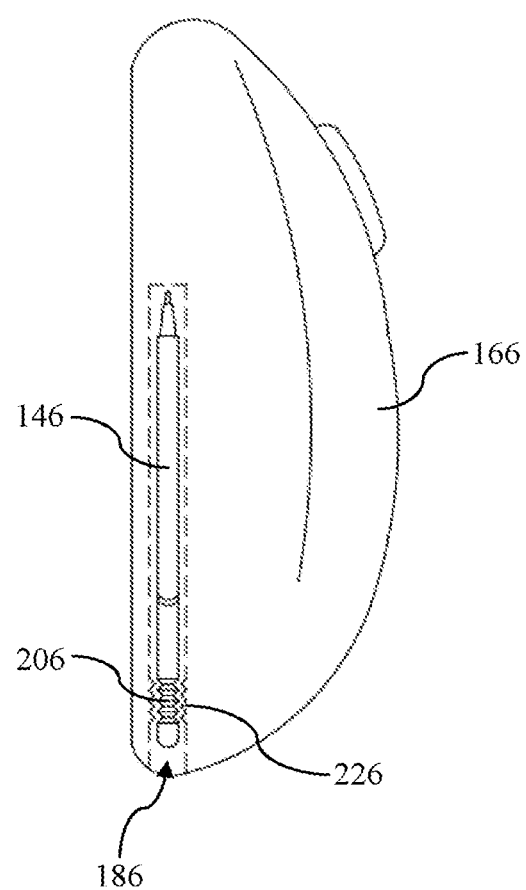
FIG. 6 is a schematic diagram in which a stylus pen and a mouse are screw-jointed according to the present invention.

FIG. 6 is a schematic diagram in which a stylus pen and a mouse are screw-jointed according to the present invention. In FIG. 6, internal threads 226 are formed on an inner wall of a housing space 186 of a mouse 166, external threads 206 are formed on a surface of an end of a pen shaft of a stylus pen 146, and the external threads 206 of the stylus pen 146 are screwed into the internal threads 226 of the mouse 166, so that the stylus pen 146 is fixed on the inner wall of the housing space 186 of the mouse 166.

Figure 7:
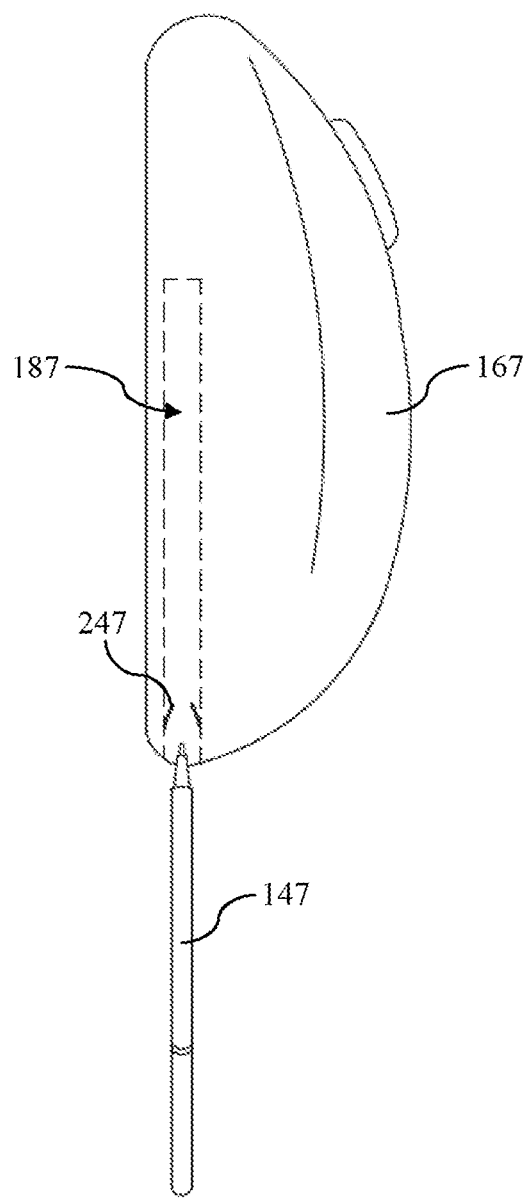
FIG. 7 is a schematic diagram in Which a stylus pen and a mouse are clamped by using one or more leaf springs according to the present invention.

FIG. 7 is a schematic diagram in which a stylus pen and a mouse are clamped by using one or more leaf springs according to the present invention. In FIG. 7, one or more leaf springs 247 are disposed on an inner wall of a housing space 187 of a mouse 167. When a stylus pen 147 is inserted in the housing space 187, the leaf springs 247 of the mouse 167 elastically clamp the stylus pen 147, so that the stylus pen 147 is fixed in the housing space 187 of the mouse 167.

Figures 8A, 8B:
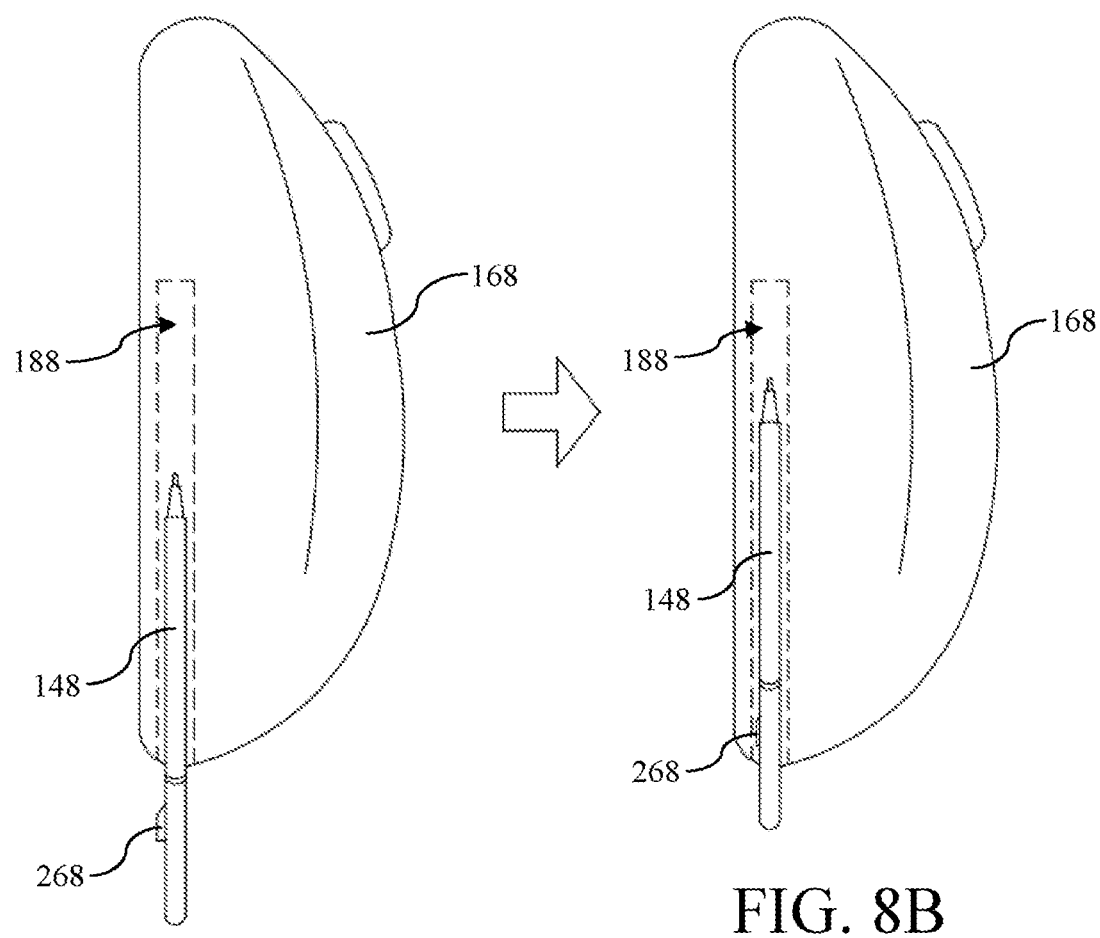
FIG. 8A is a schematic diagram in which a stylus pen and a mouse are in a non-clamped state according to the present invention.
FIG. 8B is a schematic diagram in which a stylus pen and a mouse are in a clamped state according to the present invention.

FIG. 8A is a schematic diagram in which a stylus pen and a mouse are in a non-clamped state according to the present invention, and FIG. 8B is a schematic diagram in which a stylus pen and a mouse are in a clamped state according to the present invention. In FIG. 8A, a flexible engagement part 268 is disposed at a side edge of a pen shaft of a stylus pen 148. When the stylus pen 148 is inserted into a housing space 188 of a mouse 168, an inner wall of the housing space 188 presses the flexible engagement part 268 of the stylus pen 148, and the stylus pen 148 is fixed on the inner wall of the housing space 188 by using the elasticity of the flexible engagement part 268 (as shown in FIG. 8B).

In FIG. 8A, the flexible engagement part 268 disposed at the side edge of the pen shaft of the stylus pen 148 may also be used as a switch. The stylus pen 148 includes a battery disposed inside the pen shaft (not shown in the figure), and the battery supplies power to the stylus pen 148. When the stylus pen 148 is inserted into the housing space 188 of the mouse 168, the inner wall of the housing space 188 of the mouse 168 presses the switch, that is, the inner wall of the housing space 188 of the mouse 168 presses the flexible engagement part 268 as shown in FIG. 8B, and the pressed switch cuts off the power supplied by the battery to the stylus pen 148. When the stylus pen 148 is removed from the housing space 188 of the mouse 168, the inner wall of the housing space 188 of the mouse 168 stops pressing the switch, that is, the inner wall of the housing space 188 of the mouse 168 stops pressing the flexible engagement part 268 as shown in FIG. 8A, and the battery supplies power to the stylus pen 148.

Figure 9:
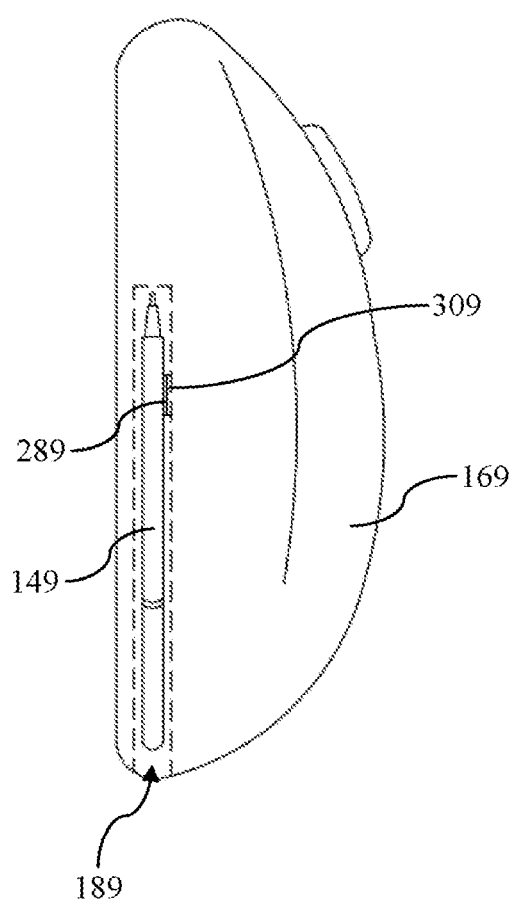
FIG. 9 is a schematic diagram in which an electrical contact of a stylus pen and an electrical contact of a mouse are electrically connected according to the present invention.

FIG. 9 is a schematic diagram in which an electrical contact of a stylus pen and an electrical contact of a mouse are electrically connected according to the present invention. An electrical contact 309 is disposed on an inner wall of a housing space 189 of a mouse 169, an electrical contact 289 is disposed on a surface of a pen shaft of a stylus pen 149, and when the stylus pen 149 is inserted into the housing space 189 of the mouse 169 to make the electrical contact 309 of the mouse 169 and the electrical contact 289 of the stylus pen 149 electrically connected, the stylus pen 149 is charged by an external computer system through the mouse 169, or the stylus pen 149 is charged by a battery (not shown in the figure) disposed inside the mouse 169. The electrical contact 309 of the mouse 169 and the electrical contact 289 of the stylus pen 149 are special contacts or USB normative contacts.

In FIG. 9, when the stylus pen 149 is inserted into the housing space 189 of the mouse 169 and the electrical contact 309 of the mouse 169 is electrically connected to the electrical contact 289 of the stylus pen 149, the mouse 169 sends a mode switching signal to the external computer system, or a Bluetooth module (not shown) of the stylus pen 149 sends the mode switching signal to the external computer system, to instruct a man-machine operation graphical interface of a computer operating system to switch from a touch mode (like a tablet computer interface) to a non-touch mode (like a personal computer interface). When the stylus pen 149 is removed from the housing space 189 of the mouse 169, the mouse 169 or the Bluetooth module of the stylus pen 149 sends the mode switching signal to the external computer system, to instruct the man-machine operation graphical interface of the computer operating system to switch from the non-touch mode to the touch mode.

When the stylus pen 149 is inserted into the housing space 189 of the mouse 169 and the electrical contact 309 of the mouse 169 is electrically connected to the electrical contact 289 of the stylus pen 149, the USB contact of the mouse 169 is electrically connected to an external computer system, which is a Windows system, and a stylus pen operation protocol such as an MPP (Microsoft Pen Protocol) or an item is written into a memory (not shown in the figure) of the stylus pen 149 by software in the external computer system or firmware in the mouse 169 through the electrical contact 309 of the mouse 169 and the electrical contact 289 of the stylus pen 149. After the stylus pen 149 is removed from the housing space 189 of the mouse 169, the stylus pen 149 operates on the touch screen 12 in the Windows system by using the stylus pen operation protocol, i.e., the MPP.

Similarly, when the USB contact of the mouse 169 is electrically connected to an external computer system such as a Mac system or an Android system, a corresponding stylus pen operation protocol of the Mac system or Android system is written into a memory of the stylus pen 149 by the external computer system through the USB contact of the mouse 169 by using the electrical contact 309 of the mouse 169 and the electrical contact 289 of the stylus pen 149. After the stylus pen 149 is removed from the housing space 189 of the mouse 169, the stylus pen 149 operates on the touch screen 12 in the Mac system or Android system by using the stylus pen operation protocol.

The present invention provides a mouse capable of receiving a stylus pen, characterized in that the stylus pen is stored inside the mouse, so as to reduce space occupied by peripheral devices and avoid making a working environment in a mess.

Although the present invention is described above with reference to the foregoing preferred embodiments and the illustrated accompanying drawings, the embodiments and drawings are not intended to limit the present invention. Various modifications, omissions, and changes made by a person skilled in the art on forms and contents of the embodiments do not depart from the scope of the claims of the present invention.

LIST OF REFERENCE NUMERALS

- 10 main screen
- 12 touch screen
- 14 stylus pen
- 16 mouse
- 142 stylus pen
- 143 stylus pen
- 144 stylus pen
- 145 stylus pen
- 146 stylus pen
- 147 stylus pen
- 148 stylus pen
- 149 stylus pen
- 162 mouse
- 163 mouse
- 164 mouse
- 166 mouse
- 167 mouse
- 168 mouse
- 169 mouse
- 182 housing space
- 183 housing space
- 184 housing space
- 186 housing space
- 187 housing space
- 188 housing space
- 189 housing space
- 204 side cover plate
- 206 external threads
- 226 internal threads
- 247 leaf springs
- 268 flexible engagement part
- 289 electrical contact
- 309 electrical contact
- 1451 first pen shaft
- 1452 second pen shaft

What is claimed is:

1. A mouse capable of receiving a stylus pen, comprising:
    a housing space capable of receiving a stylus pen is provided in the mouse, wherein the housing space forms an opening at the central side, left and right sides or lower side of the mouse, and the stylus pen is placed inside the opening and is fixed in the housing space,
    wherein a flexible engagement part is disposed at a side edge of a pen shaft of the stylus pen, and the flexible engagement part of the stylus pen is elastically clamped on an inner wall of the housing space when the stylus pen is placed inside the housing space.

2. The mouse capable of receiving a stylus pen according to claim 1, wherein the length of the stylus pen is adjusted by means of pressing.

3. A mouse capable of receiving a stylus pen, comprising:
    a housing space capable of receiving a stylus pen is provided in the mouse, wherein the housing space forms an opening at the central side, left and right sides or lower side of the mouse, and the stylus pen is placed inside the opening and is fixed in the housing space,
    wherein the stylus pen comprises a battery disposed inside a pen shaft of the stylus pen and a switch disposed at a side edge of the pen shaft of the stylus pen, the battery supplies power to the stylus pen, and when the stylus pen is placed inside the housing space, an inner wall of the housing space of the mouse presses the switch, and the pressed switch cuts off the power supplied by the battery to the stylus pen.

4. A mouse capable of receiving a stylus pen, comprising:
    a housing space capable of receiving a stylus pen is provided in the mouse, wherein the housing space forms an opening at the central side, left and right sides or lower side of the mouse, and the stylus pen is placed inside the opening and is fixed in the housing space,
    wherein an electrical contact is disposed on an inner wall of the housing space of the mouse, an electrical contact is disposed on a surface of a pen shaft of the stylus pen, and when the stylus pen is placed inside the housing space to make the electrical contact of the mouse and the electrical contact of the stylus pen electrically connected, the stylus pen is charged by a computer system through the mouse, or the stylus pen is charged by a battery in the mouse, wherein the electrical contact of the mouse and the electrical contact of the stylus pen are special contacts or USB normative contacts, and wherein when the stylus pen is inserted into the housing space and the electrical contact of the mouse is electrically connected to the electrical contact of the stylus pen, the mouse or a Bluetooth module of the stylus pen sends a mode switching signal to instruct a computer system to switch from a first mode to a second mode of a man-machine operation graphical interface, and when the stylus pen is removed from the housing space, the mouse or the Bluetooth module of the stylus pen sends the mode switching signal to instruct the computer system to switch from the second mode to the first mode of the man-machine operation graphical interface.

5. A mouse capable of receiving a stylus pen, comprising:

a housing space capable of receiving a stylus pen is provided in the mouse, wherein the housing space forms an opening at the central side, left and right sides or lower side of the mouse, and the stylus pen is placed inside the opening and is fixed in the housing space, wherein an electrical contact is disposed on an inner wall of the housing space of the mouse, an electrical contact is disposed on a surface of a pen shaft of the stylus pen, and when the stylus pen is placed inside the housing space to make the electrical contact of the mouse and the electrical contact of the stylus pen electrically connected, the stylus pen is charged by a computer system through the mouse, or the stylus pen is charged by a battery in the mouse, wherein the electrical contact of the mouse and the electrical contact of the stylus pen are special contacts or USB normative contacts, and wherein when the stylus pen is inserted into the housing space and the electrical contact of the mouse is electrically connected to the electrical contact of the stylus pen, the USB contact of the mouse is electrically connected to one of the following computer systems: a Windows system, a Mac system, and an Android system, and a stylus pen operation protocol or an item is written into a memory of the stylus pen by software in the computer system or firmware of the mouse through the electrical contact of the mouse and the electrical contact of the stylus pen.

6. A mouse capable of receiving a stylus pen, comprising:

a housing space capable of receiving a stylus pen is provided in the mouse, wherein the housing space forms an opening at the central side, left and right sides or lower side of the mouse, and the stylus pen is placed inside the opening and is fixed in the housing space, wherein the housing space is provided at the lower side of the mouse, the stylus pen is placed inside the housing space, and a side cover plate covers the housing space and the stylus pen.

* * * * *